(12) United States Patent
Kitani et al.

(10) Patent No.: US 8,707,899 B2
(45) Date of Patent: Apr. 29, 2014

(54) PLASMA PROCESSING APPARATUS

(75) Inventors: Ryouta Kitani, Hikari (JP); Nobuhide Nunomura, Hikari (JP); Yasukiyo Morioka, Kudamatsu (JP); Motohiko Yoshigai, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 510 days.

(21) Appl. No.: 12/379,636

(22) Filed: Feb. 26, 2009

(65) Prior Publication Data
US 2010/0212834 A1 Aug. 26, 2010

(51) Int. Cl.
| | | |
|---|---|---|
| C23C 16/50 | (2006.01) | |
| C23C 16/503 | (2006.01) | |
| C23C 16/505 | (2006.01) | |
| C23C 16/509 | (2006.01) | |
| C23C 16/455 | (2006.01) | |
| H01L 21/306 | (2006.01) | |
| C23F 1/00 | (2006.01) | |
| C23C 16/06 | (2006.01) | |
| C23C 16/22 | (2006.01) | |

(52) U.S. Cl.
USPC .............. 118/723 E; 118/723 R; 156/345.43; 156/345.46

(58) Field of Classification Search
USPC .......... 118/723 E, 723 R; 156/345.43, 345.46
See application file for complete search history.

(56) References Cited

U.S. PATENT DOCUMENTS

| | | | | |
|---|---|---|---|---|
| 6,045,618 A | * | 4/2000 | Raoux et al. ................... | 118/715 |
| 6,187,072 B1 | * | 2/2001 | Cheung et al. ................ | 422/168 |
| 6,223,684 B1 | * | 5/2001 | Fujioka et al. ............ | 118/723 R |
| 6,264,788 B1 | * | 7/2001 | Tomoyasu et al. ........ | 156/345.43 |
| 6,776,874 B2 | * | 8/2004 | Kobayashi et al. ...... | 156/345.51 |
| 7,048,869 B2 | * | 5/2006 | Takahashi et al. .............. | 216/70 |
| 7,338,576 B2 | * | 3/2008 | Ono et al. ................ | 156/345.46 |
| 7,390,366 B2 | * | 6/2008 | Shim ............................. | 118/715 |
| 7,691,226 B2 | * | 4/2010 | Denpoh ................... | 156/345.24 |
| 2001/0015261 A1 | * | 8/2001 | Kobayashi et al. ............ | 156/345 |
| 2002/0038791 A1 | * | 4/2002 | Okumura et al. ............... | 216/71 |
| 2002/0144706 A1 | * | 10/2002 | Davis et al. ..................... | 134/1.1 |
| 2006/0169207 A1 | * | 8/2006 | Kobayashi et al. ........... | 118/715 |
| 2008/0169065 A1 | * | 7/2008 | Takahashi et al. ....... | 156/345.35 |
| 2010/0212834 A1 | * | 8/2010 | Kitani et al. ............. | 156/345.51 |

FOREIGN PATENT DOCUMENTS

JP 2007-180467 7/2007

OTHER PUBLICATIONS

Visualization of Reverse Flowing Particles From Turbomolecular Pump Satou et al, Clean Technology, Jun. 2003 Edition, p. 20, Japan Industrial Publishing Co. Ltd.

* cited by examiner

*Primary Examiner* — Rudy Zervigon
(74) *Attorney, Agent, or Firm* — Antonelli, Terry, Stout & Kraus, LLP.

(57) ABSTRACT

A plasma processing apparatus for processing a subject placed on a subject stage disposed in a processing chamber in a vacuum vessel, by using plasma formed in said processing chamber, includes: an exhaust space communicating with the processing chamber, extending in a horizontal direction, and exhausting gas in the processing chamber; an exhaust port communicating with the exhaust space, the gas being exhausted via the exhaust port; a pump disposed communicating with the exhaust port and exhausting the gas; and a plate member disposed in the exhaust space between a connection portion to the processing chamber and the exhaust port, extending along a direction connecting the connection portion and the exhaust port, and disposed outside a view angle from an upper surface of the subject stage.

8 Claims, 2 Drawing Sheets

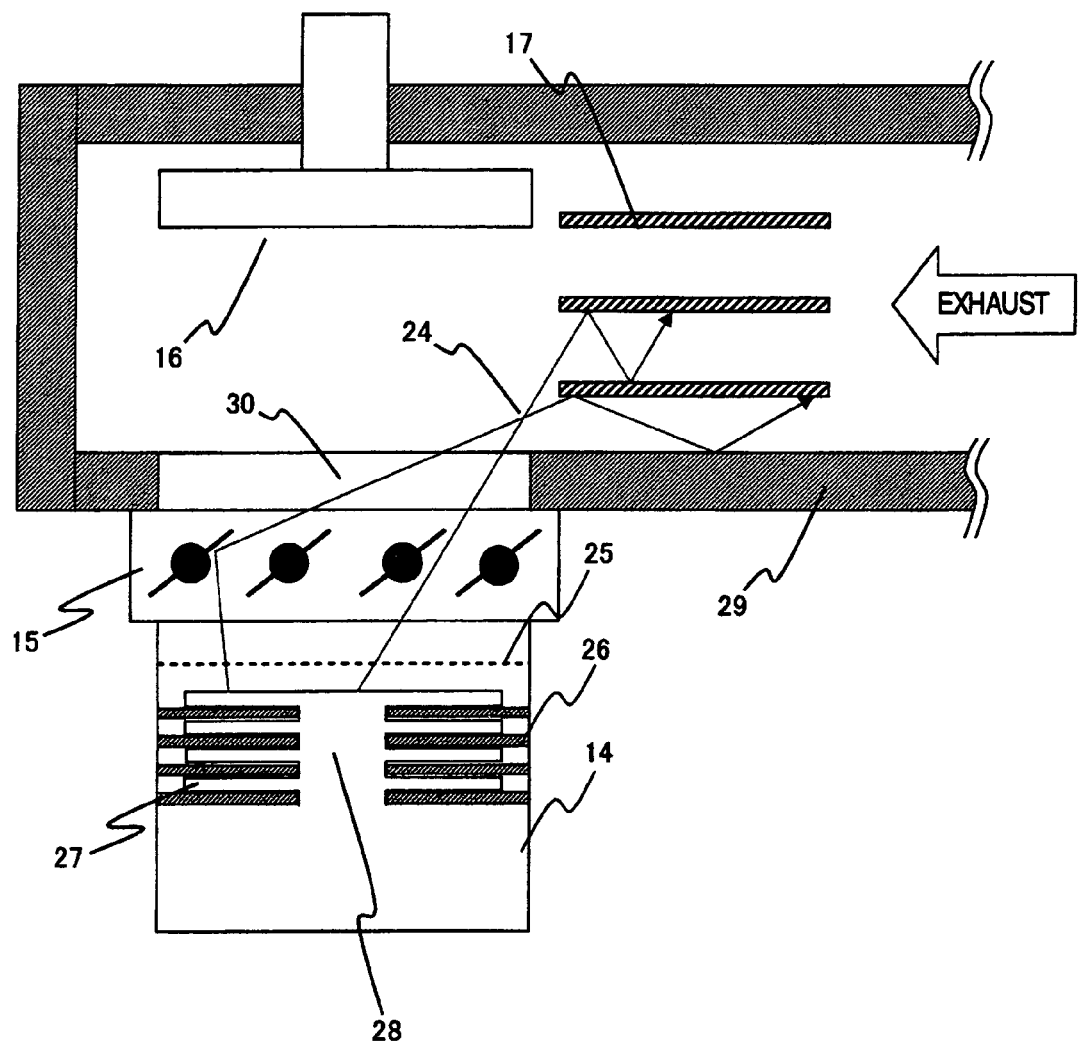

PLASMA PROCESSING APPARATUS

BACKGROUND OF THE INVENTION

The present invention relates to a plasma processing apparatus for processing a subject like a substrate such as a semiconductor wafer in a processing chamber in a vacuum container, by using plasma, and more particularly to a plasma processing apparatus capable of reducing foreign matters on a processed subject by blocking fine particles inbound from a vacuum pump side to the subject.

In a plasma processing apparatus of this type, a subject is processed generally in a reduced pressure vacuum atmosphere. In the processing apparatus of this type, it is necessary to lower a pressure in a processing chamber to a high vacuum degree when a subject is processed. In order to realize this high vacuum degree; a turbo molecular pump is generally used which is a vacuum pump equipped with a plurality of stages of vanes rotating coaxially.

Reaction products generated during plasma processing for a subject in a processing chamber and fine particles sputtered by plasma are attached to and deposited on a wall surface of the processing chamber. If such subject processing is performed for a long time duration or for a number of subjects, attached and deposited substance accumulated on the inner wall of the processing chamber may be stripped or broken due to a change in a pressure in the processing chamber, a change in a surface temperature, interaction with plasma or the like, so that fine particles are newly formed.

Although some of fine particles formed in this manner are transported to the vacuum pump and removed from the processing chamber, other fine particles are attached to the surface of a subject to form foreign matters. The following phenomenon is also known in this technical field. Fine particles arrived at an inlet opening of the vacuum pump and flying into the inside of the vacuum pump collide against vane wheels coaxially rotating at high speed. Some of collided fine particles are repelled toward the processing chamber and flown in all direction in the processing chamber to attach the surface of the subject to form foreign matters (hereinafter called rebounded contaminating matters). This phenomenon is disclosed, for example, in "Visualization of Reverse Flowing Particles from Turbomolecular Pump" by Shintarou SATOU, Clean Technology, June, 2003 edition, p. 20, Japan Industrial Publishing Co. Ltd.

Techniques of suppressing adverse affects of such rebounded contaminating matters are known as disclosed in JP-A-2007-180467. This related art discloses a method of solving the above-described issue of rebounded contamination matters by disposing a fine particle reflecting member of a circular disc type facing a turbomolecular pump, in an exhaust manifold.

SUMMARY OF THE INVENTION

As processes are executed repetitively in the processing chamber of the plasma processing apparatus, fine particles are gradually deposited on the wall of the processing chamber, and a possibility of occurrence of dropping and stripping increases. As a result, the number of floating fine particles increases, and many fine articles attach the subject and become foreign matters. Fine particles floating in plasma or in gas not generating plasma ride on a vacuum exhaust gas flow, and are transported to a turbomolecular pump. Most of the fine particles are exhausted to an external of the apparatus. However, some fine particles collide against vanes of the turbomolecular pump rotating at high speed, and are blown back. Of the blown-back fine particles (hereinafter called rebounded particles), some collide against other members and are exhausted to the external, and some are rebounded back to the subject and become foreign matters.

The above-described related art is, however, associated with some problems because the following points are not considered sufficiently.

Namely, the reflecting member facing the turbomolecular pump disclosed in JP-A-2007-180467 hinders a gas flow so that the reflecting member is likely to deposit fine particles from a wafer side, and becomes a new foreign matter generating source. Further, since a vacuum exhaust efficiency lowers, an etching performance is adversely affected.

Namely, even if it is assumed that the number of rebounded contaminating matters to the subject in the processing chamber by the reflecting member is reduced, additives and rebounded contaminating matters are deposited on the reflecting member, and there remains a fear that products attached and deposited on the reflecting member become a new foreign matter generating source. Further, in order to suppress this situation, a maintenance work such as periodical washing and replacement becomes necessary. During this maintenance work, it is necessary to stop processing a subject with the processing apparatus, and the apparatus is required to be exposed to the atmospheric air. A running factor and a process efficiency of the processing apparatus are therefore lowered.

When considering an exhaust efficiency of the turbomolecular pump, the reflecting member functions as a resistance mounted on an exhaust path. An exhaust gas flow is changed or an effective exhaust speed is lowered so that there is a fear that a processing efficiency is degraded. The above-described related art does not consider these points sufficiently, and leaves some problems.

An object of the present invention is to provide a plasma processing apparatus capable of suppressing generation of foreign matters and having improved reliability.

The above object can be achieved by a plasma processing apparatus for processing a subject placed on a subject stage disposed in a processing chamber in a vacuum vessel, by using plasma formed in the processing chamber, including: an exhaust space communicating with the processing chamber, extending in a horizontal direction, and exhausting gas in the processing chamber; an exhaust port communicating with the exhaust space, the gas being exhausted via the exhaust port; a pump disposed communicating with the exhaust port and exhausting the gas; and a plate member disposed in the exhaust space between a connection portion to the processing chamber and the exhaust port, extending along a direction connecting the connection portion and the exhaust port, and disposed outside a view angle from an upper surface of the subject stage.

The above object can be achieved by a plasma processing apparatus for processing a subject placed on a subject stage disposed in a processing chamber in a vacuum vessel, by using plasma formed in the processing chamber, including: an exhaust duct communicating with the processing chamber, extending in a horizontal direction, and exhausting gas in the processing chamber; an exhaust port communicating with the exhaust space, the gas being exhausted via the exhaust port; a pump disposed communicating with the exhaust port and exhausting the gas; and a plate member disposed in the exhaust duct between a connection portion to the processing chamber and the exhaust port, extending along a direction of a gas flow in the exhaust duct, and disposed outside a view angle from an upper surface of the subject stage.

The above object can be achieved further by the plasma processing apparatus wherein: a space forming the plasma in the processing chamber has a cylindrical shape; the subject stage has a tubular shape and is coaxially disposed with the plasma forming space; the exhaust space is a polygonal space having as a plan shape extending, in a horizontal direction, from an opening of the connection portion disposed in a lower portion of the subject stage; and the exhaust port is disposed at a bottom of the exhaust space spaced apart from the opening along the horizontal direction.

The above object can be achieved further by that an end portion of the plate member on a side of the processing chamber is positioned on a side of the exhaust port relative to the connection portion.

Other objects, features and advantages of the invention will become apparent from the following description of the embodiments of the invention taken in conjunction with the accompanying drawings.

BRIEF DESCRIPTION OF THE DRAWINGS

FIG. 2 is a vertical cross sectional view illustrating the outline structure near an exhaust duct of the embodiment illustrated in FIG. 1.

DESCRIPTION OF REFERENCE NUMERALS

Figure 1:
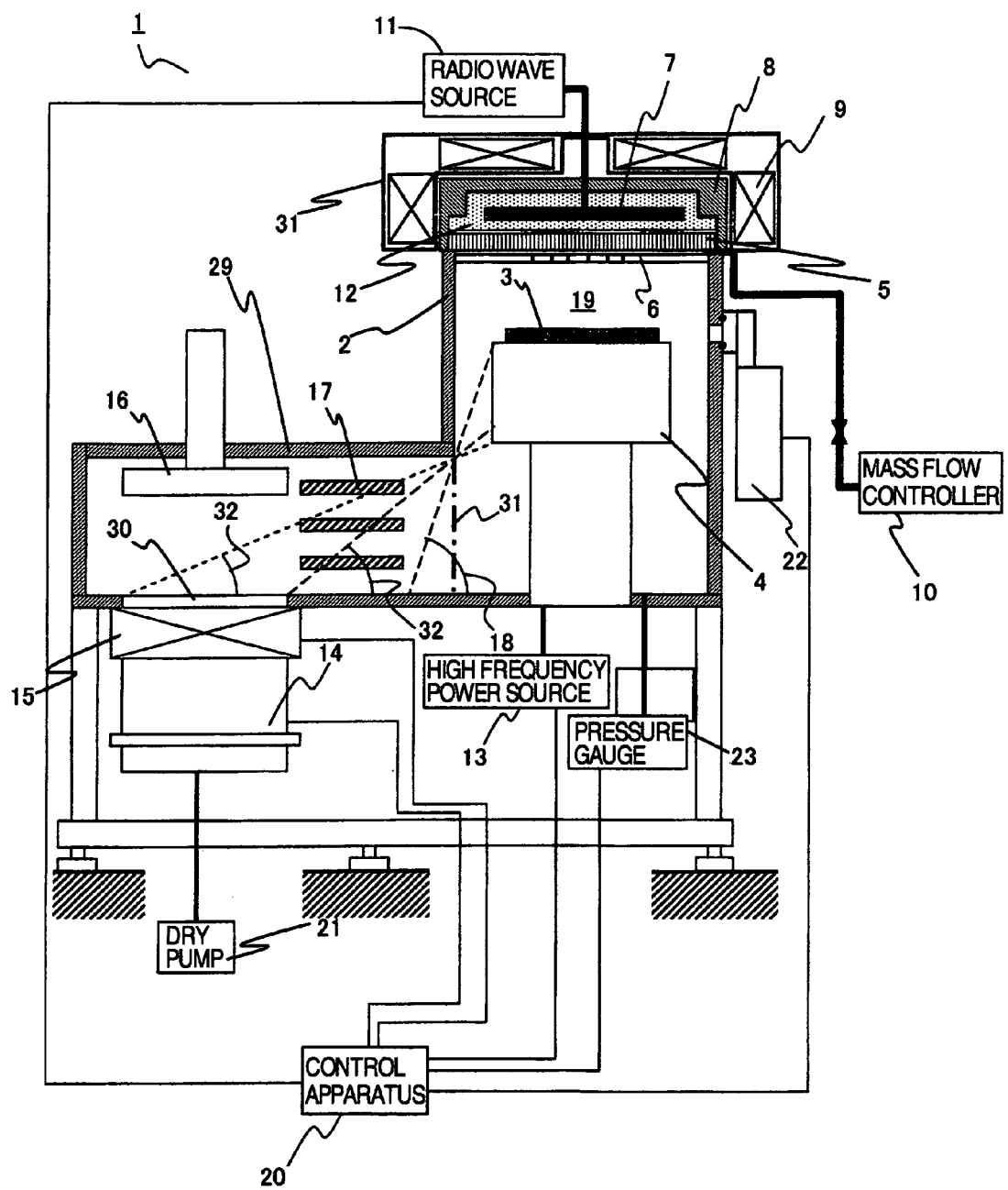
FIG. 1 is a vertical cross sectional view illustrating the outline structure of a processing chamber of a plasma processing apparatus according to an embodiment of the present invention.

1 . . . plasma processing apparatus, 2 . . . processing vessel, 3 . . . subject, 4 . . . subject stage, 5 . . . lid member, 6 . . . shower plate, 7 . . . antenna, 8 . . . lid member, 9 . . . solenoid coil, 10 . . . mass flow controller, 11 . . . radio wave source, 12 . . . dielectric member, 13 . . . high frequency power source, 14 . . . turbomolecular pump, 15 . . . variable valve, 16 . . . lid, 17 . . . plate-like reflecting member, 18 . . . view angle, 19 . . . processing chamber, 20 . . . control apparatus, 21 . . . dry pump, 22 . . . gate valve, 23 . . . pressure gauge, 24 . . . loci of rebounded particles, 25 . . . net, 26 . . . fixed vanes, 27 . . . vane wheel, 28 . . . rotary shaft, 29 . . . exhaust duct (or space), 30 . . . exhaust port, 31 . . . discharge.

DETAILED DESCRIPTION OF THE EMBODIMENT

An embodiment of the present invention will be described with reference to the accompanying drawings.

Description will now be made on the embodiment of the present invention with reference to FIGS. 1 and 2.

FIG. 1 is a vertical cross sectional view illustrating the outline structure of a processing chamber of a plasma processing apparatus according to the embodiment of the present invention. FIG. 2 is a vertical cross sectional view illustrating the outline structure near an exhaust duct of the embodiment illustrated in FIG. 1.

Referring to FIGS. 1 and 2, a plasma processing apparatus 1 is constituted of: a vacuum vessel disposing therein a processing chamber in which a subject is processed; a discharging unit disposed outside an upper portion of the vacuum vessel and surrounding the upper portion; and an exhausting unit coupled to a lower portion of the vacuum vessel for exhausting gas in the processing chamber. The discharging unit is equipped with an electric field supply device and a magnetic field supply device respectively disposed on an outer circumferential side of the upper portion of a processing vessel 2, which is a cylindrical portion of the vacuum vessel, and covering the upper portion. The vacuum vessel is also constituted of an exhaust duct 29 communicating with the processing chamber in the processing vessel 2 and coupled to the processing vessel 2 along the horizontal direction.

As described above, the processing vessel 2 is a vessel constituted of the cylindrical portion of the vacuum vessel, and has therein a processing chamber 19 having a cylindrical shape and a subject stage 4 having a cylindrical shape disposed coaxially in the processing chamber. An opening (gate) is formed through the side wall of the processing vessel 2 at a height flush with the upper surface of the subject stage 4, and when a subject is transported into or out of the inside of the processing vessel, the subject passes through the opening. A gate valve 22 is disposed outside the gate and outside the side wall of the processing vessel, in order to open the gate or close the gate in an airtight manner.

Further, in the upper portion of the processing vessel 2 and above the processing chamber 19, a shower plate 6 of a disc shape is disposed constituting the ceiling of the processing chamber and having a plurality of holes. A lid member 5 of a disc shape made of dielectric material is disposed above the shower plate with a fine gap therebetween. A gas supply tube communicates with this fine gap. Process gas for processing a subject is supplied to the gap. The supplied gas diffuses in the gap and is introduced into the processing chamber 19 via a plurality of through holes disposed in a central area of the shower plate 6.

Disposed above the processing vessel 2 are the shower plate 6 and the disc-shaped lid member 5 made of dielectric material, and another lid member 8 of a cylindrical shape disposed on the lid member 5 and constituting the vacuum vessel. Disposed inside the lid member 8 are an antenna 7 and a dielectric member 12. The antenna 7 made of conductive material having a disc shape is the electric field supply unit connected to a radio wave source 11 and supplied with a high frequency power to apply an electric field to the inside of the processing chamber 19. The dielectric member 12 of a ring shape is disposed between the antenna 7 and lid member 8. A solenoid coil 9 as a magnetic field generating unit is disposed surrounding the outer circumference of the lid member 8 and processing vessel 2 above or sideway the side wall thereof, to thereby apply a magnetic field to the inside of the processing chamber 19.

The exhaust duct (or space) 29 is coupled to the cylindrical portion of the processing vessel 2 and communicates with the processing chamber 19 in the processing vessel. In this embodiment, the exhaust duct (or space) 29 has a shape capable of being regarded as a polyhedron constituted of a polygonal shape as a plan shape of a portion constituting the vacuum vessel and flat plates of side walls extending in an up/down direction.

The inside of the exhaust duct is a space functioning as a flow path for gas and particles of products or the like in the processing chamber 19 to be flown from the processing chamber 19 and be exhausted from a bottom exhaust port 30. This space serving as the flow path extends in a horizontal direction relative to an up/down direction axis of the cylindrical portion of the processing chamber 19, and communicates with the processing chamber at an opening 31 as a connection portion to the processing chamber 19. The exhaust flow path of the exhaust duct 29 extends from the opening 31 to the upper portion of the exhaust port 30 along a direction coupling the opening and port (coupling both centers). Gas in the processing chamber 19 flows via the opening 31 into the flow path in the horizontal direction, and thereafter, flows into a turbomolecular pump 14 disposed spaced apart in the horizontal direction from the axis of the processing chamber 19, to be exhausted to the external. Above an inflow port of the turbomolecular pump 14 and through a bottom wall of the exhaust duct 29 at a position spaced from the processing vessel 2 along the horizontal direction, there is disposed the circular exhaust port 30 communicating with the inflow port and passing gas and particles in the processing chamber 19 therethrough.

A circular lid 16 for opening/closing the exhaust port 30 is disposed above the exhaust port, and coupled to the upper portion of the exhaust duct 29 together with a driver unit. An exhaust flow path is formed between the exhaust port 30 and the inflow port of the turbomolecular pump 14 at a downstream position of the exhaust port. In this exhaust flow path, a plurality of variable valves 15 are disposed for variably adjusting a flow path area of the exhaust flow path by rotating around the horizontal direction axis. Further, a dry pump 21 coupled via a flow path to the turbomolecular pump 14 is disposed at a downstream position of the turbomolecular pump 14. The dry pump roughly exhausts gas in the processing chamber 19 to reduce a pressure at which the turbomolecular pump 4 can be operated. With this arrangement, the inside of the processing chamber 19 can be maintained at a high vacuum even if a subject is processed by plasma and products are formed while a process gas is supplied via the through holes of the shower plate 6. In this embodiment, the cross sections of the exhaust port 30, turbomolecular pump 14 and exhaust flow paths interconnecting the port and pump are circular, and disposed coaxially.

A pressure in the processing chamber 19 is detected with a pressure gauge 23 mounted under the processing vessel 2. The pressure gauge 23 is connected in a communicable state to a control apparatus 20 for adjusting the operations of a high frequency power source for supplying a high frequency power to electrodes made of conductive material and disposed inside the subject stage 4, the radio wave source 11, a mass flow controller 10 and the like. A signal representative of a pressure is transmitted from the pressure gauge 23 to the control apparatus 20, and in accordance with a pressure value detected from this signal, the control apparatus 20 transmits signals for adjusting the operations such as process gas supply to the variable valves 15 or turbomolecular pump 14 so that the subject processing conditions such as a pressure can be adjusted even during processing.

Furthermore, in this embodiment, a plurality of plate-like reflecting members 17 extending in a horizontal direction and juxtaposed in an up/down direction are disposed in the exhaust flow path of the exhaust duct (or space) 29. More in particular, a plurality of these plate-like reflecting members 17 are disposed in parallel along the exhaust gas motion direction (along a flow direction) at the position in the exhaust duct (or space) 29 between an intermediate point of a line coupling the opening 31 and exhaust port 30, and outside a view angle 18 of viewing the opening 30 from an outer circumferential edge of the subject stage 4 (more in particular, an outer circumferential edge of the subject 3 such as a semiconductor wafer placed on a subject placing plane constituting the upper surface of the subject stage 4). The operation of these plate-like reflecting members 17 will be described later.

Description will now be made on the operation of the plasma processing apparatus 1 constructed as above. When the subject is processed, in accordance with a host control apparatus for controlling manufacture of a semiconductor device in a room (not shown) such as a clean room installed with the plasma processing apparatus 1, the gate valve of the processing vessel 2 designated by the control apparatus 20 is opened, and the subject is transported above the subject stage 4 and placed on the subject stage in the depressurized processing chamber 19.

As the subject 3 is sucked and held with an electrostatic sucking apparatus (not shown) on the upper surface of the subject stage 4, heat conduction gas such as He is introduced between the subject 3 and subject placing surface. Next, process gas whose flow rate is adjusted with the mass flow controller 10 passes through the gap between the lid member 5 and shower plate 6, and supplied via a plurality of holes formed through the shower plate 6 into the processing chamber. An electric field emitted from the antenna 7 by power supplied to the antenna 7 is guided via the lid member 5 and shower plate 6 into the processing chamber 19, whereas a magnetic field generated by the solenoid coil 9 is supplied to the processing chamber 19. With interaction of these process gas, electric field, and magnetic field, substance of the process gas is excited, and plasma is formed in the inner space above the subject 3.

Further, a bias potential formed above the subject by the power supplied to the electrodes in the subject stage 4 from the high frequency power source 13 attracts charged particles in plasma toward the subject 3 to thereby start an etching process for the subject 3. When a film thickness or etching thickness judgment apparatus (not shown) judges that etching progresses for a predetermined time or to a predetermined thickness, the high frequency power source 13 is turned off in response to a command from the control apparatus 20. Next, supply of the process gas is stopped, and unnecessary gas in the processing chamber 19 is exhausted by maximizing conductance of the variable valves (setting an opening degree of each valve to 100%).

Thereafter, electrostatic suction of the subject 3 is released and the gate valve 22 is opened to transport the subject 3 to an external. Thereafter, a new subject 3 is transported to repeat similar processes.

As such processes are repeated, the above-described particles are gradually deposited on the inner wall of the processing chamber 19, increasing a possibility of dropping and stripping. As a result, the number of floating particles increases, and the number of particles attaching the subject and becoming foreign matters increases. Furthermore, floating particles in plasma or in simple gas flow not generating plasma ride on a vacuum exhaust gas flow and are exhausted to the turbomolecular pump 14. Most of the particles are exhausted to the outside of the apparatus. However, some particles are collide against vanes of the vane wheels 27 rotating around the rotary shaft 28 at high speed in the turbomolecular pump 14, and are blown back. Of the blown-back fine particles (called rebounded particles), some collide against other members and are exhausted to the external, and some are rebounded back to the subject and become foreign matters.

Examples of loci 24 of rebounded particles are indicated by broken lines in FIGS. 1 and 2. Whether rebounded particles reach the subject 3 depends upon the inner shape of the plasma processing apparatus from the turbomolecular pump 14 to subject. As a whole, a flow of gas in the vacuum vessel occurs between a space (upstream side) in the processing chamber 19 above the subject 3 and the exhaust port 30 of the exhaust duct 29 above the turbomolecular pump 14. A flow (motion) of particles increases its fluid force acting upon inner particles, the higher a pressure in the processing chamber and the larger a flow rate are. It is therefore desired that the subject 3 is processed at a pressure and a flow rate capable of reducing foreign matters to be caused by rebounded particles blown back by the turbomolecular pump 14. However, realizing this condition may degrade a processing efficiency depending upon the processing conditions. In a plasma processing apparatus having a possibility of processing under this condition, it is necessary to suppress rebounded particles from flying to the subject 3 and becoming foreign matters.

This embodiment has a mechanism of reducing foreign matters to be formed by rebounded particle in the exhaust duct 29 on the upstream side of the turbomolecular pump 14 flying into the processing chamber and moving above the subject 3. Namely, a plurality of plate-like reflecting members 17 extending in the horizontal direction and juxtaposed in the up/down direction are disposed in the exhaust duct 29 between the opening 31 and exhaust port 30.

At least part of these reflecting members 17 is disposed inside a view angle 32 of the exhaust port 30 into the processing chamber via the opening 31. Since blown-back rebounded particles sputter linearly via the exhaust port 30, this sputter locus is blocked and an area of the processing chamber 19 exposed to the exhaust port 30 via the opening 31 and reflecting members 17 is reduced.

More in particular, in this embodiment, a cover made of dielectric material such as quartz is disposed on the upper surface or upper side wall of the subject stage 4 to protect the inside of the subject stage 4 from interaction with particles in plasma and reactive substance in process gas. This cover faces plasma formed above the subject stage 4 or is adjacent to plasma so that its temperature is high. Even if particles in plasma such as products attach the cover, the particles are likely to dissolve or liberated. The reflecting members 17 of the embodiment are disposed in such a manner that the cover is not exposed to the exhaust port 30 via the opening 31 and reflecting members 17. Namely, the plurality of reflecting members 17 shade the exhaust port 30 from the cover to suppress rebounded particles flying from the exhaust port 30 from attaching the cover, dissolving again, floating in the upper portion of the processing chamber 19, and becoming foreign matters.

Consider the case that the reflecting members 17 are disposed inside the view angle 18 from the upper surface of the subject stage 3. In this case, end portions of the reflecting members 17 protrude into the processing chamber 19, and hinder a gas flow in the processing chamber. Further, products and particles in exhaust gas are likely to attach the reflective members. These products and particles deposited on the reflecting members 17 are directly exposed to the upper surface of the subject stage 4 in the processing chamber 19, resulting in a new foreign matter forming source.

In this embodiment, the reflecting members 17, particularly the end portions thereof on the upstream side, are disposed outside the view angle 18 from the upper surface of the subject stage 4, particularly from its outer circumference edge, and are not protruded into the processing chamber 19. Further, since the reflecting members 17 are disposed in the exhaust duct 27 in parallel to an exhaust direction, an exhaust flow is suppressed from being hindered by the reflecting members 17. With this arrangement, generation of foreign matters by the reflecting members 17 can be suppressed. Further, rebounded particles from the turbomolecular pump 14 or variable valves 15, and opening 30 colliding against the reflecting members 17 consume their kinetic-energy and are suppressed from acquiring new kinetic-energy. Therefore, even if particles are rebounded, a speed is decelerated to a speed equal to or lower than the speed at the time of incidence. It is therefore difficult to fly in an exhaust flow to the subject 3, and foreign matters rebounded by the exhaust mechanism can be reduced.

In the plasma processing apparatus 1 described above, in order to perform maintenance such as cleaning and inspection of the inside of the processing chamber 19, the vacuum vessel is periodically exposed to the atmospheric air to perform cleaning and component exchange, and the exhaust duct is cleaned. The reflecting members 17 may be structured to be able to mount and dismount, and may be exchanged with cleaned reflecting members or new reflecting members. With this arrangement, since the exhaust path is reflected, an efficiency of a maintenance work for the reflecting members 17 disposed in the exhaust duct 29 improves, and the apparatus running efficiency improves. Although these components may be made of metal, since the structures are simple, these components may be made of quartz or ceramics free of metal contamination. In this case, cleaning with acid is possible so that cleaning can be performed effectively.

As described so far, according to the present invention, since the structure for blocking and suppressing rebounded particles from the turbomolecular pump 14 in the exhaust duct 29 is provided, rebounded foreign matters are suppressed, and an exhaust efficiency or maintenance workability can be improved.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus for processing a subject placed on a subject stage disposed at a lower portion of a central portion of a processing chamber in a vacuum vessel, by using plasma generated in a plasma generating space, which has a substantially cylindrical shape and is disposed above said subject stage inside said processing chamber, comprising:

an exhaust space which is disposed below said plasma generating space and is extending outward in a horizontal direction from said processing chamber, said exhaust space being communicating with said processing chamber so that a gas in said processing chamber flows to said horizontal direction into said exhaust space;

an opening which is disposed at a lower portion of said processing chamber and beneath an upper surface of said subject stage where said subject is located, and communicates with said exhaust space and a space between an outer side wall of said subject stage and an inner side wall of said processing chamber, through said opening said gas within said processing chamber flowing into said exhaust space;

an exhaust port which is disposed at a lower portion of said exhaust space, said exhaust port being distanced in the horizontal direction from said opening so that said gas within said processing chamber entering into said exhaust space through said opening and flowing thereinside to the exhaust port and being exhausted via the exhaust port;

a turbo-molecular pump disposed so as to communicate with said exhaust port and exhaust said gas; and a plate member which is disposed at a position inside said exhaust space with gaps both on an upper side and a lower side thereof between said opening and said exhaust port which are distanced each other in said horizontal direction, a surface of said plate member extending along said horizontal direction, said plate member being located at a position so that at least a position of said late member can block linear sputter locus of articles from said exhaust port and an upstream edge with respect to said gas flow inside said exhaust space of said plate member is not directly exposed to an outer edge in a side of said opening of said upper surface of said subject stage.

2. The plasma processing apparatus according to claim 1, wherein:
said subject stage has a tubular shape and is coaxially disposed with said plasma generating space;
said exhaust space is a polygonal space having as a plan shape extending, in a horizontal direction, from said opening; and
said exhaust port is disposed at a bottom of said exhaust space spaced apart from said opening along the horizontal direction.

3. The plasma processing apparatus according to claim 1, wherein:
at least a portion of said plate member is disposed inside a view range in a case where said opening is looked up from said exhaust port;
an end portion of said plate member on a side of said processing chamber is positioned on a side of said exhaust port relative to said opening.

4. A plasma processing apparatus for processing a subject placed on a subject stage disposed at a lower portion of a central portion of a processing chamber in a vacuum vessel, by using plasma generated in a plasma generating space which has a substantially cylindrical shape and is disposed above said subject stage inside said processing chamber, comprising:
an exhaust duct which is disposed at a lower portion of said processing chamber beneath said plasma generating space and an upper surface of said subject stage where said subject is located, communicates with a space between an outer side wall of said subject stage and an inner side wall of said processing chamber, and extends outward from said processing chamber in a horizontal direction, a gas in said processing chamber flowing into said exhaust duct and then being exhausted out therethrough;
an exhaust port which is disposed at a lower portion of said exhaust space and communicates with a space inside of said exhaust duct, said exhaust port being distanced in the horizontal direction from an entrance opening of said exhaust duct which communicates with said space between an outer side of said subject stage and an inner side wall of said processing chamber, and said gas in said processing chamber entering into said exhaust duct and flowing therethrough and being exhausted via said exhaust port;
a turbo-molecular pump disposed so as to communicate with said exhaust port and exhaust said gas; and
a plate member disposed inside said exhaust duct with gaps both on an upper side and a lower side thereof, and between said exhaust port and said entrance opening of said exhaust duct, said entrance opening facing a side wall of said subject stage, said plate member extending along a direction of a gas flow in said exhaust duct, and said plate member being located at a position so that at least a position of said plate member can block linear sputter locus of particles from said exhaust port and an entrance side edge of said plate member is not directly exposed to an outer edge in a side of said opening of said upper surface of said subject stage.

5. The plasma processing apparatus according to claim 4, wherein:
said subject stage has a tubular shape and is coaxially disposed with said plasma generating space;
said exhaust duct is a space extending, in a horizontal direction, from said opening; and
said exhaust port is disposed at a bottom of said exhaust space spaced apart from said opening along the horizontal direction.

6. The plasma processing apparatus according to claim 4, at least a portion of said plate member is disposed inside a view range when said opening is looked up from said exhaust port;
an end portion of said plate member on a side of said processing chamber is positioned on a side of said exhaust port relative to said opening.

7. The plasma processing apparatus according to claim 2, wherein:
at least a portion of said plate member is disposed inside a view range is case where said opening is looked up from said exhaust port;
an end portion of said plate member on a side of said processing chamber is positioned on a side of said exhaust port relative of said opening.

8. The plasma processing apparatus according to claim 5, wherein:
at least a portion of said plate member is disposed inside a view range is case where said opening is looked up from said exhaust port;
an end portion of said plate member on a side of said processing chamber is positioned on a side of said exhaust port relative of said opening.

* * * * *